(12) United States Patent
Huang et al.

(10) Patent No.: US 7,828,046 B2
(45) Date of Patent: Nov. 9, 2010

(54) HYBRID WICKING MATERIALS FOR USE IN HIGH PERFORMANCE HEAT PIPES

(76) Inventors: Xiao Huang, 18 Staten Way, Ottawa (CA) K2C 4E7; George Stephen Franchi, 49 Fairmont Avenue, Apt. #1, Ottawa (CA) K1Y 1X4

( * ) Notice: Subject to any disclaimer, the term of this patent is extended or adjusted under 35 U.S.C. 154(b) by 1362 days.

(21) Appl. No.: 11/185,013

(22) Filed: Jul. 20, 2005

(65) Prior Publication Data
US 2007/0084587 A1 Apr. 19, 2007

Related U.S. Application Data

(60) Provisional application No. 60/589,565, filed on Jul. 21, 2004.

(51) Int. Cl.
*F28D 15/00* (2006.01)
(52) U.S. Cl. .............................. 165/104.26; 165/104.33
(58) Field of Classification Search ............ 165/104.26, 165/104.33
See application file for complete search history.

(56) References Cited

U.S. PATENT DOCUMENTS

| | | |
|---|---|---|
| 3,152,774 A | 10/1964 | Wyatt |
| 3,229,759 A | 1/1966 | Grover |
| 3,840,069 A | 10/1974 | Fischer et al. |
| 4,039,703 A | 8/1977 | Kamijo et al. |
| 4,108,239 A * | 8/1978 | Fries ..................... 165/104.26 |
| 4,196,504 A | 4/1980 | Eastman |
| 4,274,479 A | 6/1981 | Eastman |
| 4,311,733 A | 1/1982 | Inoue |
| 4,495,988 A | 1/1985 | Grossman |
| 4,565,243 A | 1/1986 | Ernst |
| 4,674,565 A | 6/1987 | Beam |
| 4,732,887 A | 3/1988 | Obanawa |
| 4,885,129 A | 12/1989 | Leonard |
| 4,903,761 A * | 2/1990 | Cima ..................... 165/104.26 |
| 4,929,414 A | 5/1990 | Leonard |

(Continued)

FOREIGN PATENT DOCUMENTS

JP    2003155503 A  *  5/2003

(Continued)

OTHER PUBLICATIONS

Machine translation of Foreign Patent JP-2003-155503.*

(Continued)

*Primary Examiner*—Ljiljana (Lil) V Ciric
(74) *Attorney, Agent, or Firm*—Adrian D. Battison; Ade & Company, Inc.

(57) ABSTRACT

Hybrid wicking materials are used in high performance heat pipes where a bi-modal distribution of pore sizes offers advantages over a homogeneous monolithic porous structure. This wick is comprised of sintered metal powder formed on a foam, felt, screen or mesh metal substrate. A fine pore structure is formed by the metal powder while the substrate is comprised of large pores. The large pores are several times, preferably five times to several orders of magnitude larger in size than the small pores. The sintered powder metal and the metal substrate may be made of nickel, copper, molybdenum, niobium, aluminum, iron, cobalt, titanium and alloys based on these metals. This provides a wicking material with axial and radial variations in pore size for optimized performance under both horizontal and against gravity orientations.

25 Claims, 7 Drawing Sheets

U.S. PATENT DOCUMENTS

| | | | |
|---|---|---|---|
| 4,964,457 | A | 10/1990 | Leonard |
| 5,101,560 | A | 4/1992 | Leonard |
| 5,335,720 | A | 8/1994 | Ogushi |
| 5,814,372 | A | 9/1998 | Moya |
| 6,306,488 | B1 | 10/2001 | Rainer |
| 6,569,495 | B2 | 5/2003 | Rainer |
| 6,648,063 | B1 | 11/2003 | Andraka |
| 6,719,947 | B1 | 4/2004 | Jha |
| 6,815,050 | B2 | 11/2004 | Rainer |
| 6,880,626 | B2 | 4/2005 | Lindemuth |
| 6,896,039 | B2 * | 5/2005 | Dussinger et al. ...... 165/104.26 |
| 2003/0136551 | A1 * | 7/2003 | Bakke ................... 165/104.26 |
| 2003/0141045 | A1 | 7/2003 | Oh et al. |

OTHER PUBLICATIONS

Thermal hydraulic characterization of stainless steel wicks for heat pipe applications, Canti et al., ENEA, Energy Department, Via Anguillarese, 301 00060 S.M. di Caleria, Rome, Italy, Received Jun. 10, 1997, accepted Oct. 20, 1997, pp. 5-16.

* cited by examiner

HYBRID WICKING MATERIALS FOR USE IN HIGH PERFORMANCE HEAT PIPES

CROSS REFERENCE TO RELATED APPLICATION

This patent application relates to, and claims the priority benefit from, U.S. Provisional Patent Application Ser. No. 60/589,565 filed on Jul. 21, 2004 entitled HYBRID NICKEL WICKING MATERIALS FOR USE IN HIGH PERFORMANCE HEAT PIPES and which is incorporated herein in its entirety.

FIELD OF THE INVENTION

The present invention relates to hybrid wicking materials for use in high performance heat pipes and other fields where a non-uniform, hybrid wick structure, with optimized permeability, capillary pumping pressure and increased total surface area, could offer superior performance over monolithic wick materials.

BACKGROUND OF THE INVENTION

Heat pipes are compact, passive heat transfer devices capable of handling high heat fluxes with a minimal temperature difference. Typical temperature differences are approximately 20° C. from heat source to heat sink. This versatile invention is employed in a wide range of applications, from spacecraft temperature control, waste heat recovery and microelectronics cooling to other applications where rapid heat dissipation is required. A heat pipe's heat transport capacity is highly dependent on the properties of the porous wicking structure, the material that provides the capillary pumping action necessary for working fluid transport. An optimum wick will provide high capillary pumping pressure with good permeability for minimal flow resistance. Both properties are dependent on the characteristics of the wick structure. For example, capillary pressure increases as pore size decreases, yet permeability is adversely affected at the same time.

Presently, homogeneous wick structures (ie: wicks with one nominal pore size) have the disadvantage of compromising between these characteristics to achieve suitable performance. However, hybrid wicks offer a possible solution: a structure with bi-modal pore sizes can offer both high capillary pumping pressure and excellent permeability, thus satisfying both criteria simultaneously. Additionally, depending on its location within a heat pipe, there are different performance requirements imposed on the wick material. For example, since the capillary pumping pressure is mostly affected by the pore size of the wick in the evaporator section, it is desirable to have a finer pore size at the evaporator and a coarse pore size at the condenser. A smooth transition between these two sections is also necessary to minimize end-to-end pressure drops. The focus of this invention is the development of new hybrid wicking materials with optimally combined fine and coarse porous structures for heat pipe applications. Other fields, where performance is primarily dependent on the optimization of porous materials, in the sense of enhanced heat transfer or otherwise, will also benefit from these hybrid porous structures.

A heat pipe is a heat transfer device with high thermal conductivity. It consists of a sealed container, a porous wicking material and a working fluid. Air is evacuated from the container and an adequate amount of working fluid is added to fully saturate the wick. The container is then sealed and the heat pipe is connected to a heat source and heat sink. Examples of heat pipe devices are described in U.S. Pat. Nos. 3,152,774 and 3,229,759.

Heat pipe applications reflect their remarkable versatility. Thermal management of microelectronics and spacecraft temperature control are two main areas where the application of heat pipes is extensively reported. Other notable industrial uses include the preservation of permafrost in pipeline applications and thermosyphons used in nuclear power generators.

Porous, sintered (U.S. Pat. No. 4,885,129) or plated (U.S. Pat. No. 4,311,733) wicks are commonly used in electronics cooling applications. Other wick structures such as wrapped metal screens or felt and axial grooves are also used, however their reduced capillary pumping ability hinders operation in unfavourable orientations (ie: against gravity operation). Additionally, heat pipes constructed from wrapped screen or felt material are susceptible to developing hot spots impeding or blocking liquid movement. This phenomenon occurs because poor thermal contact between the wick and the inside wall of the container are potential bubble nucleation sites which impede heat transfer. Heat pipes for spaceflight applications typically use axial grooves as wicks with ammonia as the working fluid. However, sintered metal copper or nickel wicks are also used in the loop heat pipe designs. Other types of heat pipes were also reported to contain U-shaped heat pipes with sintered copper wicks and acetone as the working fluid. To further enhance the performance of heat pipes containing grooves, hybrid grooved structure has been proposed and fabricated with both axial and circumferential (radial) channels as described in U.S. Pat. No. 5,335,720.

In order to increase the effective heat transfer rate, several modifications have been proposed to improve homogeneous wick structures. In the following references, U.S. Pat. Nos. 6,880,626, 4,274,479 and 4,929,414, a vapour chamber with grooves or arteries in combination with sintered powders claimed to improve both capillary pumping performance and film boiling resistance. However, complex fabrication techniques were involved and required the formation of grooves or arteries by machining, powder preform or sacrificial polymer lines prior to sintering. Additionally, these fabrication methods are not capable of axially or radially varying the porous structure through the wick.

In U.S. Pat. Nos. 5,101,560 and 4,964,457, metal powder was sintered onto a wire screen under a magnetic field to make an anisotropic wick structure for unidirectional heat pipes. In this disclosure, the purpose of the wire screen was as a support/carrier for the metal powder. The wire screen itself was not used to enhance heat transfer performance and metal powder coverage onto the screen was not intentionally controlled to provide optimized heat transfer performance. Some success has already been demonstrated using this idea. A composite, layered stainless steel wick comprised of highly permeable metal screens and a fine pore sintered metal powder layer was shown to perform better than either a screen or sintered wick alone, as disclosed in Canti et al., *Thermal Hydraulic Characterization of Stainless Steel Wicks for Heat Pipe Applications*, Rev. Gen. Therm., V37, pp 5-16, 1998. However, this structure is not ideal since the presence of layer interfaces could introduce vapour traps which may impede liquid flow through the wick.

A composite heat pipe is detailed in U.S. Pat. No. 4,565,243. The wick in the evaporator region is constructed from sintered metal powder, while the wick in another region of the heat pipe consists of a screen to permit bending of the pipe without destruction of the sintered powder. In order to remove thermal energy during power surges, a thicker wick is incorporated into the sections adjacent to the evaporator. This feature provides an extra fluid reservoir, as described in U.S. Pat. No. 4,674,565. As seen from the above survey, hybrid wick structures have been proposed in a number of similar applications. However, they are significantly different from what is disclosed in this invention.

Other related composite structures for non-heat pipe applications are also reviewed. In U.S. Pat. Nos. 6,719,947, ceramic or metal foam was used as structural support for sintered powder material. Since all pores in the foam were covered with sintered powder, the resulting material could only assume a single nominal pore size. Furthermore, the material was intended for filtration applications only.

Similar to the previously described patent, an organic composite porous material has also been proposed (U.S. Pat. Nos. 4,732,887, 5,814,372, 6,306,488, 6,569,495, and 6,815,050). This patent consists of a porous cellulose material with its large pores covered with a secondary porous polymeric material. The purpose of the secondary material is to provide mechanical strength and dimensional stability while at the same time permitting fluid entry into the primary cellulose material for filtration or extraction applications.

U.S. Pat. No. 6,648,063 discloses a perforated metal plate which is added onto a sintered stainless steel felt, its purpose being to provide structural support.

Thus, it is evident that widespread heat pipe applications along with ample opportunities for advancement in wick design create the need for novel porous wick materials.

SUMMARY OF THE INVENTION

The present invention provides a variable bi-modal wick structure with optimized pore size distribution for higher heat transfer performance, particularly in adverse orientations such as against gravity. Orientations that place the evaporator above the condenser force the wick to pump liquid against gravity and as such require high capillary pressure difference.

The present invention provides a simple, cost effective means to fabricate such a bi-modal structure. Furthermore, it is another object of this invention to provide a method to produce an axially variable bi-modal wick material for enhanced heat transfer performance. It is still another object of this invention to provide a method of producing a bi-modal wick material with optimized radial pore size distribution in order to take advantage of nucleate boiling while at the same time reducing the likelihood of film boiling. It is yet another objective to fabricate a bi-modal wick material with enhanced strength and structural stability through the use of a ductile, pliable, and porous substrate. It is also another object of this invention to produce a wick material exhibiting unidirectional properties through the axial and radial variation of wick pore size. It is still another object of this invention to provide a porous material with larger total surface area for filtration, heat exchanger, and battery applications.

In one aspect of the present invention there is provided a wicking material, comprising;

a porous metal substrate of foam, felt, mesh, or screen, said porous metal substrate having a length defining an axial direction and a thickness defining a radial direction transverse to said axial direction, the porous metal substrate enclosing a vapor flow passageway in said axial direction; and a porous sintered metal powder formed on the porous metal substrate, said porous sintered metal powder and said porous metal substrate forming a hybrid microstructure having at least two distinct distributions of first pores of a first size and at least second pores of a second size, said first size being larger than said second size.

The present invention also provides a heat pipe, comprising; a metal housing defining a chamber and including an evaporator zone, an adiabatic zone downstream of said evaporator zone, and a condenser zone downstream of said evaporator zone;

a wicking material contained in said chamber and spanning said evaporator, adiabatic and condenser zones, said wicking material including a porous metal substrate of foam, felt, mesh, or screen, said porous metal substrate having a length defining an axial direction and a thickness defining a radial direction transverse to said axial direction, the porous metal substrate enclosing a vapor flow passageway in said axial direction, and a porous sintered metal powder formed on the porous metal substrate, said porous sintered metal powder and said porous metal substrate forming a hybrid microstructure having at least two distinct distributions of first pores of a first size and at least second pores of a second size, said first pores being larger than said second pores; and wherein when heat is absorbed into the evaporator zone liquid entrained in the wicking material is evaporated to form a vapor, and wherein the vapor flows down said vapor flow passageway through said adiabatic zone and into said condenser zone whereupon said vapour condenses to form said liquid thereby releasing heat, and wherein said liquid flows back through said wicking material to said evaporator zone.

BRIEF DESCRIPTION OF THE DRAWINGS

Preferred embodiments of the invention will now be described, by way of example only, with reference to drawings. Drawings are not necessarily to scale. For clarity and conciseness, certain features of the invention may be exaggerated and shown in schematic form.

DETAILED DESCRIPTION OF THE INVENTION

Figure 1:
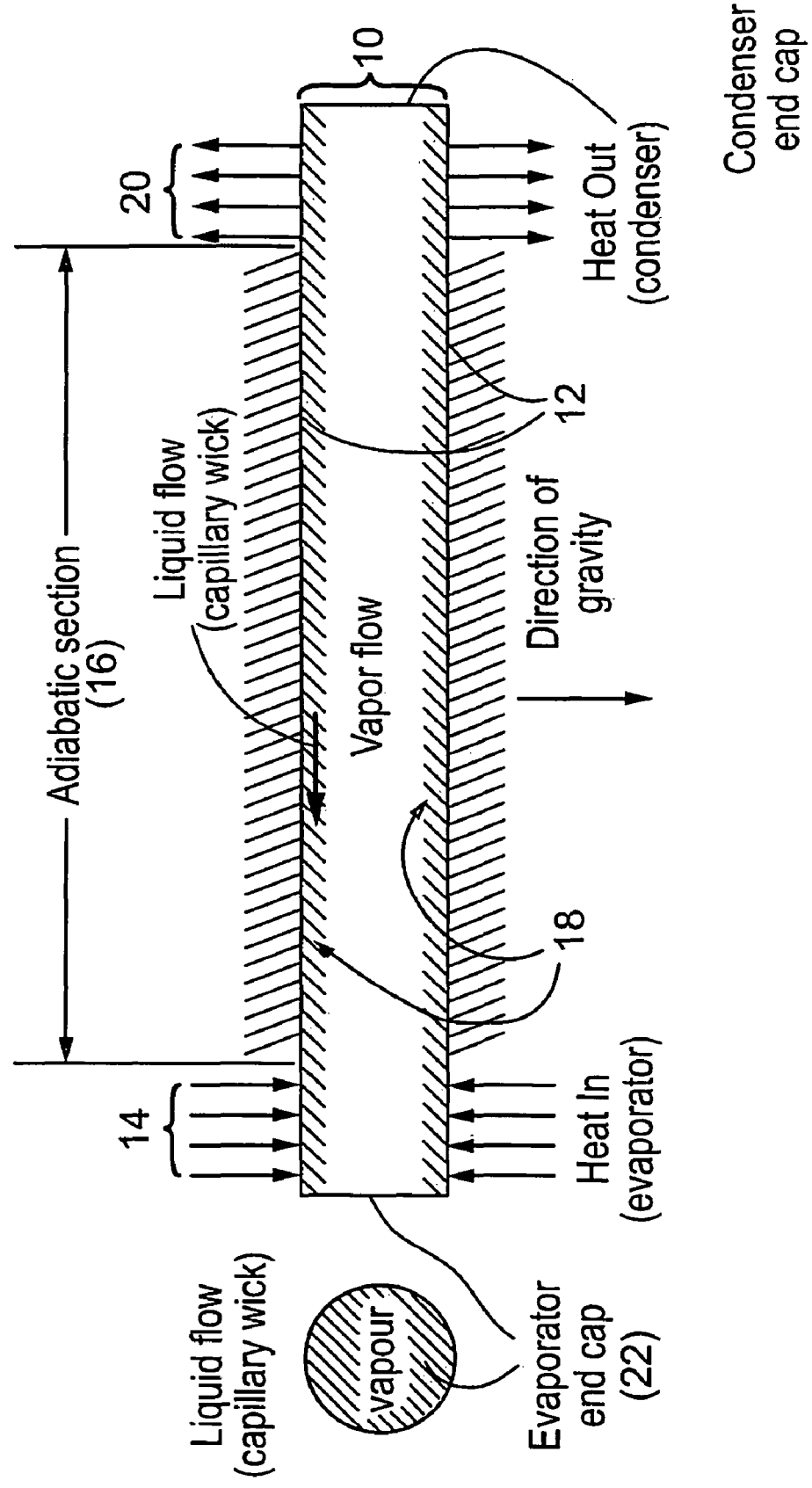
FIG. 1 shows a schematic drawing of a heat pipe constructed in accordance with the present invention.

Referring to FIG. 1, a heat pipe shown generally at 10 includes a housing or container 12 defining three distinct zones or sections, an evaporator zone 14, an adiabatic zone 16, a condenser zone 20 and a capillary wick 18 located in housing 12 extending through the evaporator zone 14, adiabatic zone 16 and condenser section 20 through which liquid flows. The capillary wick 18 is shown as cylindrical concentric with housing 12 and encloses a vapor flow passageway 22 along which the vapour flows. Radial direction in this embodiment refers to the direction from heat pipe wall 12 to the center of the vapour flow passageway 22. The axial direction in this context refers to longitudinal direction along which the vapour and fluid travel within the heat pipe.

The heat pipe 10 includes an evaporator end cap at one end of the housing 12 at the end of the evaporator zone 14 and a condenser end cap at the other end of the housing 12 at the end of the condenser zone 20 which are leak tight seals to prevent loss of liquid from the heat pipe 10. Examples of the liquid that may be used in the heat pipe include water, acetone, methanol, ammonia and liquid metals.

Heat addition takes place in the evaporator zone 14 by conduction through the container 12 and wick 18. The working fluid in the evaporator zone 14 then evaporates, absorbing its latent heat of vapourization. A pressure difference causes the vapour to flow through the adiabatic section 16 to the condenser section 20 through passageway 22. In the adiabatic zone 16 there is generally little or no heat transfer between the heat pipe and environment. The adiabatic zone basically provides a gradual temperature and vapour pressure changes between the evaporator zone 14 and condenser zone 20 with the wick structure in this zone providing passage to the fluid and the core providing passage to the vapour. In the condenser zone 20 the vapor releases its latent heat of vapourization, condensing back into the liquid. The porous wick 18 then transports the liquid back to the evaporator zone 14 by capillary action where the cycle repeats itself.

Working fluid selection depends on the operating temperature of the heat pipe. The melting point of the liquid must be below the operating temperature. Additionally, the critical temperature of the fluid (the temperature above which a substance does not have distinct gas and liquid phases) must be above the operating temperature.

For proper heat pipe operation, the maximum capillary pumping pressure provided by the wick ($\Delta P_c$) must be greater than the sum of the following pressure drops: a) the liquid pressure drop needed to transport the fluid from the condenser to the evaporator through the wick ($\Delta P_l$); b) the vapour pressure drop required to move the fluid from the evaporator to the condenser ($\Delta P_v$); and c) the hydrostatic pressure due to gravity ($\Delta P_g$). This can be expressed mathematically as:

$$\Delta P_c \geq \Delta P_l + \Delta P_v + \Delta P_g \quad (1)$$

The above equation is referred to as the "capillary wicking limit" and is the most significant limitation to heat transport for heat pipes used in the temperature range (−150° C. to 350° C.). If this condition is not satisfied, the wick will not be able to return the working fluid to the evaporator, and dryout will occur.

Figure 2:
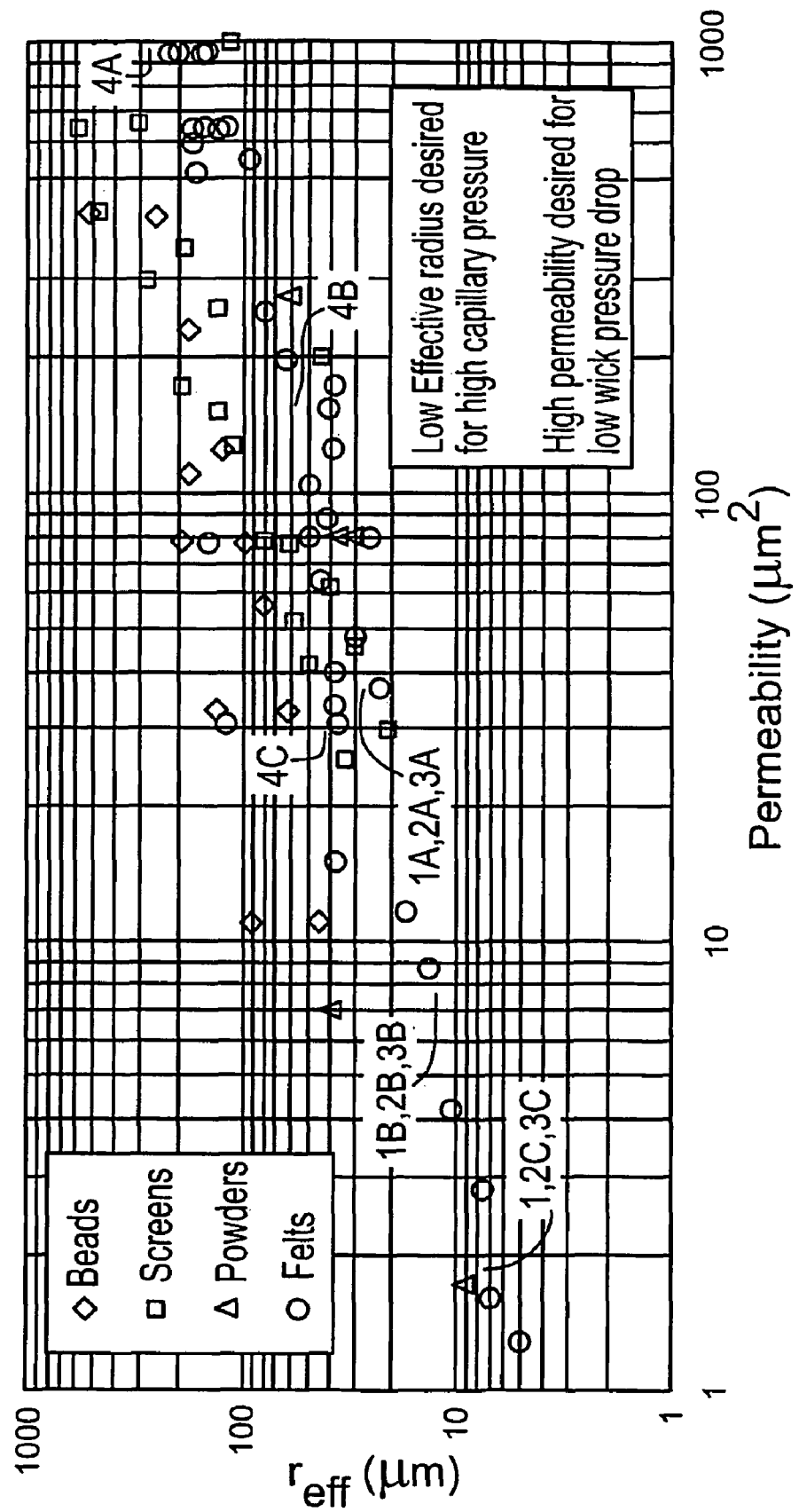
FIG. 2 shows a plot of pore radius ($\mu m$) versus permeability ($\mu m^2$) for various wicks.

The two terms in Equation (1) that can be optimised through wick design are $\Delta P_l$ and $\Delta P_c$. High liquid permeability will minimise the liquid pressure drop through the wick since an inverse relationship exists between these parameters as described in Darcy's law. FIG. 2 is a graph demonstrating the widespread range of permeability and pore sizes for various microstructures. The graph also shows the trend towards lower permeability with decreasing pore size. On the other hand, high capillary pumping pressure can be achieved by providing a small pore radius, made evident in Equation (2) below. The maximum capillary pressure a wick can sustain is given by:

$$\Delta P_c = \frac{2\sigma_l}{r} \quad (2)$$

where $\sigma_l$ is the surface tension of the working fluid and r is the "effective" pore radius. Therefore, Equations (1) and (2) indicate that higher liquid permeability and a smaller nominal pore size are simultaneously required to maximize a heat pipe's heat transport capacity. Thus, proper wick design is crucial for optimum heat pipe operation.

If the radial heat flux in the evaporator is too high, nucleate boiling or film boiling could occur. While nucleate boiling permits high forced convection heat transfer rates, film boiling, on the other hand, will form a vapor barrier between the heat pipe wall and the liquid. This phenomenon reduces the effective heat transfer rate. Four modes of heat transfer progressively lead to this type of failure. During the mode 1, conduction and natural convection transfer heat through the liquid saturated wick. In Mode 2, the liquid starts receding into the pores of the wick as heat flux increases. If the capillary force is not high enough to deliver liquid to the evaporator, dryout will occur at this stage. Here, conduction still controls heat transfer.

In Mode 3, nucleate boiling begins with the formation of vapor bubbles at the heat pipe wall. These bubbles work through the wick and burst at the liquid—vapour interface. Nucleate boiling does not necessarily pose a problem as long as the vapour bubbles can escape from the wick. Indeed, many researchers have concluded that nucleate boiling permits very high forced convection heat transfer rates. With higher temperature differences between the wall and the vapor, Mode 4 is encountered and film boiling arises. Here, larger quantities of vapor are generated and form an insulating layer against the heat pipe wall. As a result, liquid flow to the wall is impeded, causing a rapid increase in wall temperature and a reduction in heat transfer efficiency.

Both pore size and wick porosity have a significant impact on the onset of nucleate boiling and film boiling. It is therefore an important issue in designing wick structures, particularly in the evaporator section of heat pipes, to take advantage of nucleate boiling while at the same time preventing film boiling from occurring. The ability to vary the pore size, porosity, surface areas and surface morphology radially will allow designers to select the suitable wick structure for the intended application. The invention disclosed herein provides methods to achieve this radial variation in pore size, porosity and total surface areas.

An ideal heat pipe wick possesses the smallest possible pore size for high capillary pumping with the highest permeability for maximum liquid mass flow and hence, maximum heat transport. However, for simple homogeneous wicks, decreasing the pore size also decreases liquid permeability such that a compromise must be reached between these two factors. The inventors have discovered that with the presence of two different pore sizes simultaneously in the same wick, increased capillary pumping is accomplished by the fine pore structure with axial fluid transport being handled by the larger pores. It will be understood by those skilled in the art that in certain applications having more than two pore sizes in the wicking material may also be advantageous. This independence ensures high permeability without resorting to a larger pore size.

Thus the new wick material disclosed herein having at least two pores sizes exhibits high permeability due to the existence of the large pores and increased capillary pressure arising from the incorporation of the smaller pores distributed on the wall of large pores. This increased capillary pressure is best seen when larger numbers of fine pores are distributed on the walls of large pores in the evaporator and immediately adjacent to the vapor core (space).

Additionally, gradual variation of the axial and radial distribution of the smaller pores further enhances the performance of the heat pipe through combined effects such as improved capillary pumping, better permeability and possibly enhanced heat transfer arising from nucleate boiling. Thus, a fully integrated bi-modal structure is more desirable to provide improved heat transfer efficiency for high performance heat pipes.

The wicking material disclosed herein is a hybrid microstructure with a controlled amount of large and fine pores. Small pore sizes are in the range of sub-micrometers to tens of micrometers and are highly desirable for good capillary pumping performance. The larger pore structure should have a pore size sufficient for high permeability, ideally orders of magnitude greater than the smaller pore size. Since sintered metal powders and metallic foam, screen, mesh or felt can be manipulated to obtain a wide range of pore sizes and subsequent characteristics, these are the materials of choice. Based on these qualities, the creation of new hybrid wick materials is provided herein.

Figure 3:
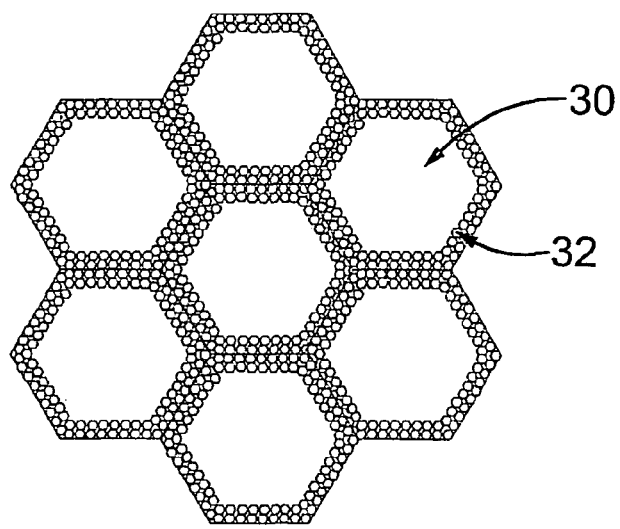
FIG. 3 shows a schematic diagram illustrating a bi-modal wick structure constructed in accordance with the present invention.

The wicking material produced in accordance with the present invention includes a substrate of porous, metallic material in the form of foam, felt, mesh or screen with large open pores 30, and metal powder sintered onto the substrate to form a finer porous structure 32, several times finer, but preferably one or several orders of magnitude smaller than that of the substrate as illustrated in FIG. 3.

The characteristics of the finer pore structure (including pore size and shape, porosity, and surface area) can be modified through selection of powder material, slurry mixture, application technique and sintering process parameters. The characteristics of the larger pore structure are primarily determined by the selection of the substrate material. However, these may be slightly modified through the sintering process as well. This results in a structure with a bi-modal pore size distribution.

Referring to FIG. 3, the powder can have any generic physical form such as spherical, polygon, irregular, filamentary or short fibres. The powder material particle size can be varied to achieve desired porosity, pore shape and size in combination with application method and sintering conditions. The resulting porosity of the substrate, metal foam, felt, screen or mesh, may not be reduced by more than 50% after the sintering of the powder material.

Non-limiting examples of materials from the metal powder and substrate may be made include, but are not limited to, nickel, copper, molybdenum, niobium, aluminium, iron, cobalt or alloys based on these metals, or any combination of the metals suitable for the application environment and cost preference.

Figure 4:
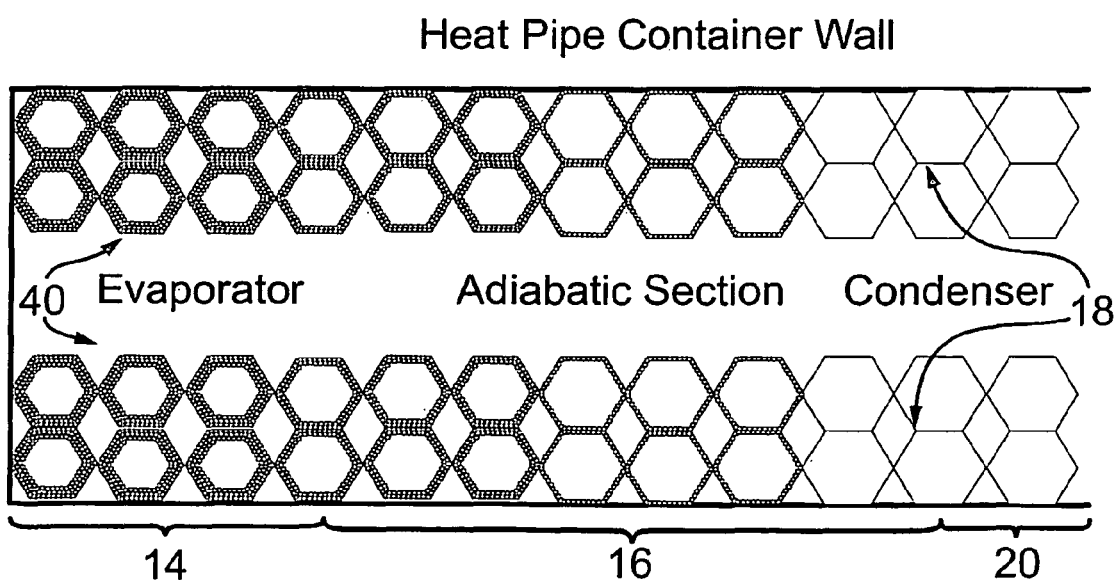
FIG. 4 is a schematic diagram illustrating an axially varied bi-modal wick structure with high concentration of finer pores in the evaporator section and gradually reduced concentration of finer (smaller) pores in the adiabatic and condenser sections.

In another embodiment, the wicking material may also be made using a mixture of metal powder and foam, felt, mesh or screen where the axial distribution of metal powder on the foam, felt, mesh or screen is in such a manner that a larger concentration of finer pores 40 are located in the evaporator section 14. Referring to FIG. 4, the concentration of finer pores are gradually reduced throughout the evaporator section 14 and adiabatic section 16, reaching a minimum before reaching the condenser section 20, while the condenser section 20 of the wick 18 is comprised primarily of larger pores. The extent of fine pore reduction is controllable and dependent on the application.

The large pores may be several times, preferably one or several orders of magnitude larger in size than the fine pores. The metal powder and substrate can be nickel, copper, molybdenum, niobium, aluminium, iron, cobalt or alloys based on these metals, or any combination of the metals suitable for the application to mention some non-limiting examples. The metal powder can assume any generic form as described above. This axially varied wick structure is also capable of providing unidirectional heat transfer.

Figure 5:
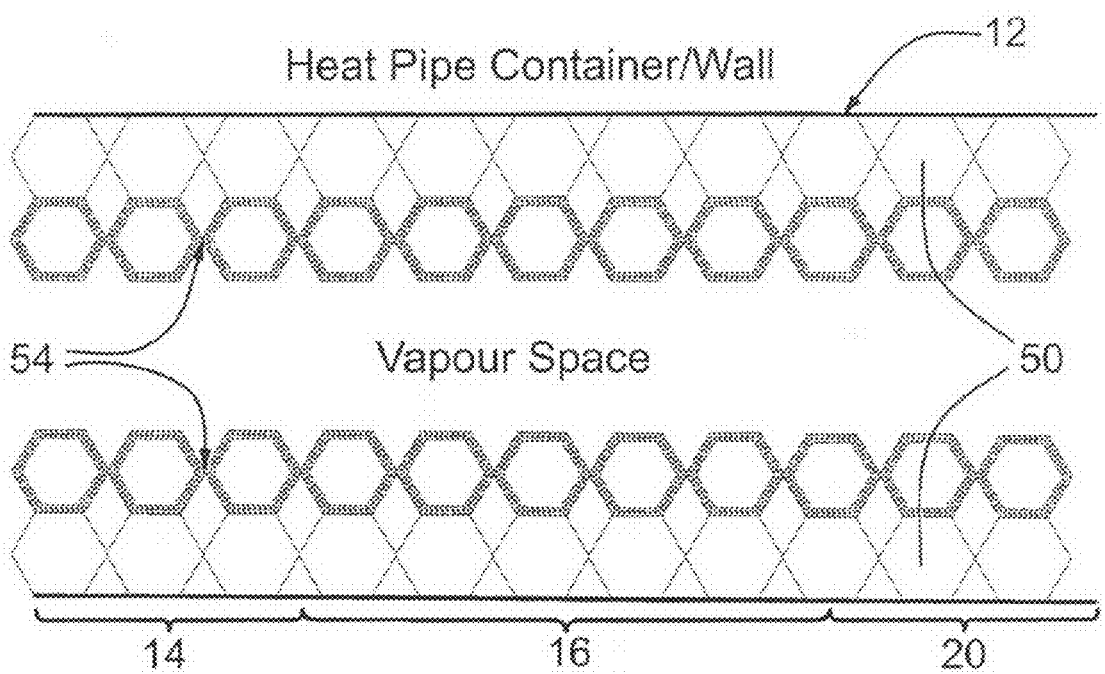
FIG. 5 is a schematic diagram illustrating a radially varied bi-modal wick structure with higher concentration of finer (smaller) pores in the wick adjacent to vapour space and coarse (larger) pores near the container wall.

Referring to FIG. 5, in another embodiment of the hybrid wick, the wicking material may include a combination of metal foam, felt, mesh or screen substrate 50 and a radially varying distribution of finer pores resulted from metal powder 54 sintered onto the substrate 50. The radially varying distribution is in such a manner that a larger concentration of finer pores, in the evaporator section 14 or throughout sections 14, 16 and 20, is located on the wick interface immediately adjacent to the vapour space. Additionally, the concentration of finer pores along the heat pipe wall-wick interface is significantly reduced from the location adjacent to the vapour space. An extreme case is schematically presented in FIG. 5 where there is no sintered structure adjacent to the wall 12, instead it only contains the coarse structure 50 offered by the porous metal substrate, whether it be a mesh, or foam. The extent of reduction in fine pore concentration is controllable and dependent on the application. However, the distribution of fine pores can be tailored to more complex distribution modes using the invention described herein.

As with the previous embodiments, the large pores may be several times, preferably one or several orders of magnitude larger in size than the fine pores and non-limiting examples of metal powder and substrate that may be used include, but are not limited to, nickel, copper, molybdenum, niobium, aluminium, iron, cobalt or alloys based on these metals, or any combination of the metals suitable for the application. The metal powder can assume any generic form as described above. The porous sintered metal powder may be produced from a powder having a shape selected from the group consisting of spherical, irregular, filamentary or fiber.

In another embodiment of the wicking material, structures with both of the above two features may be produced which include axially and radially varying small pore concentrations. The evaporator zone 14 preferably will contain more of the smaller pores and the concentration of smaller pores preferably tapers down as it moves from the evaporator zone 14 to the adiabatic section 16. The condenser zone 20 preferably will have virtually the substrate coarse structure. The small pore size may be varied. The preferred pore size for small pores are about 10 times smaller than the large pores, a preferred range being from about 0.5 to about 50 microns for the small pores and from about 50 to about 1000 microns for the large pores.

The size of the smaller pores can be tailored by selecting powder size, powder type in terms of shape of the particles (e.g. spherical or angular, filament, rod-shaped), application method and sintering process. It will be appreciated that while the above description has disclosed two types of pore sizes, large and small, it will be appreciated that heat pipes may be constructed with a range of different sized pores. Similarly, while the above description discloses the porous metal substrate having the larger pores than those produced by the metal powder after it is sintered, it will be appreciated that the metal substrate or sintered metal alone could be produced with both the larger and smaller pores meeting the bi-modal structural definition described in this invention, additional smaller pores may be incorporated into the structure if needed by further sintering. Further, instead of two distinct pore sizes it will be appreciated that either the metal substrate or the sintered powder, or both, could be produced with both sizes of pores, or each could be produced with one or more pores sizes, with any axial or radial distribution throughout the wicking material. This distribution may be different depending on the application for which the wicking material is being used, with the bi-modal and axial and radial distributions described herein being preferred when the wicking material is being used to produce a heat pipe.

The present invention uses several fabrication methods for producing the wick material with a bi-modal porous structure. Method 1 involves brushing, painting or spraying metal powders onto a foam, felt, screen or mesh substrate. Method 2 involves dipping the foam, felt, screen or mesh into a metal powder slurry and method 3 involves coating a foam, felt, screen or mesh substrate with metal powders through any commercial coating process. It will be understood that there are other commercially application methods which may be used for constructing the hybrid or bi-modal wicking structure disclosed herein.

The present invention uses a sintering process that metallurgically binds the powder material to the wall (or periphery) of the large pores whereby the smaller pores are formed along or around the walls of the larger pores and bonds the wick structure onto the heat pipe walls at the same time. In sintering method 1, a vacuum furnace sintering process is used. In sintering method 2, a furnace sintering process in protective or reducing atmosphere is used.

The invention will be illustrated using the following non-limiting, exemplary examples.

EXAMPLE 1

Figure 6:
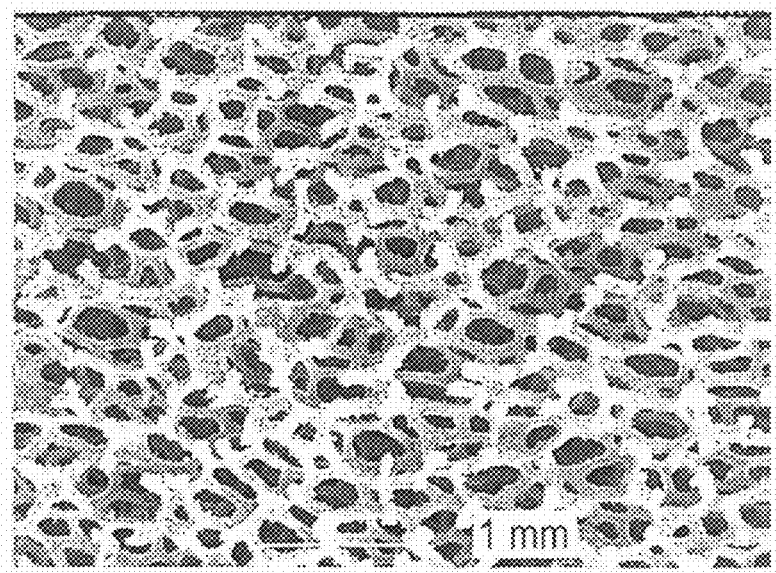
FIG. 6 shows a scanning electron microscope (SEM) image of the sintered Ni hybrid structure.

A nickel foam substrate with a characteristic pore size ranging from 300-500 μm was used. A filamentary or globular Ni power was applied to the Ni foam substructure. Experimentation with different binders, binder consistency and slurry application techniques was performed to achieve an optimum microstructure. It will be appreciated that different application techniques may be used including painting, coating, spraying or immersing the substrate within the slurry mix or dry powder. Sintering can be performed in a protective atmosphere, a vacuum or a hydrogen environment. Sintering time varies from approximately 10 minutes to 3 hours while the temperature varies from 700 to 1100° C. Through the nickel powder sintering process, fine pores are formed on the foam cell walls while the large pores present in the original Ni foam remain largely unobstructed as illustrated in FIG. 6. The smaller pore size formed is in the range of 0.5 micron to a few tens of microns and depended on the starting powder size, shape and sintering condition.

EXAMPLE 2

In this example a copper powder was sintered onto a copper mesh. Experimentation with different binders, binder consistency and slurry application techniques was performed to achieve an optimum microstructure. It will be appreciated that different application techniques may be used including painting, coating, spraying or immersing the substrate within the slurry mix or dry powder. Sintering was performed in a vacuum environment. Sintering time varies from approximately 40 minutes to 3 hours while the temperature varies from 700 to 1000° C. The resulted copper based bi-modal structure is used in heat pipe testing. Example 3 details the heat pipe testing results. The method described in the example is also advantageous for use in miniature copper-based heat pipes, since a very thin layer of copper wick can be produced for easy insertion into the container. It also offers a simplified method of manufacturing miniature heat pipes with sintered structures where the copper mesh serves as a metal powder carrier.

Using the hybrid wick structure described herein, heat pipes have been manufactured and tested to demonstrate their improved characteristics. Hybrid wicks were sintered onto copper tubes and charged with an appropriate amount of water. Studies were conducted in both horizontal and against gravity orientations. The presented results demonstrate against gravity performance, where higher capillary pressure is required.

EXAMPLE 3

Figure 7:
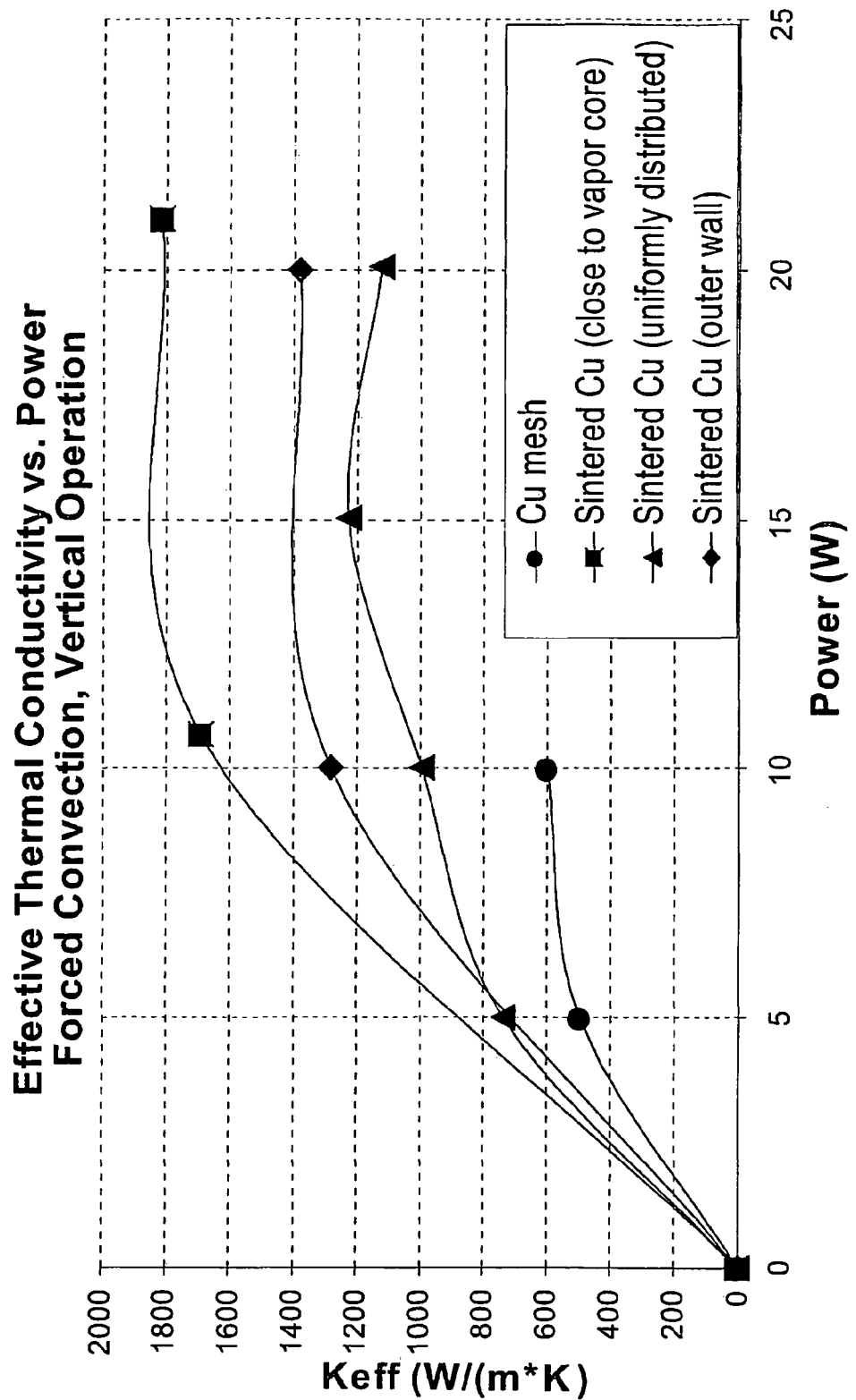
FIG. 7 is a plot showing effective thermal conductivity of heat pipes containing hybrid copper powder wicks (tested under against gravity position)

FIG. 7 presents the effective thermal conductivity of the sintered copper based hybrid nickel wick structure tested under against gravity condition. Improved performance of a uniform copper based hybrid wick structure (evaporator, adiabatic and condenser sections all contain the same hybrid structure) over a monolithic copper mesh wick was observed exhibiting a twofold increase in effective thermal conductivity at 10 W power input.

Radial variation of the hybrid wick structure, particularly with larger concentration of small pores in the area adjacent to the vapor core, results in a threefold increase in effective thermal conductivity. The improvement is less pronounced when the larger concentration of smaller porous structure is placed against heat pipe container wall. This behaviour is a further evidence of the importance in the ability to tailor the wick according to its location within a heat pipe.

EXAMPLE 4

Figure 8:
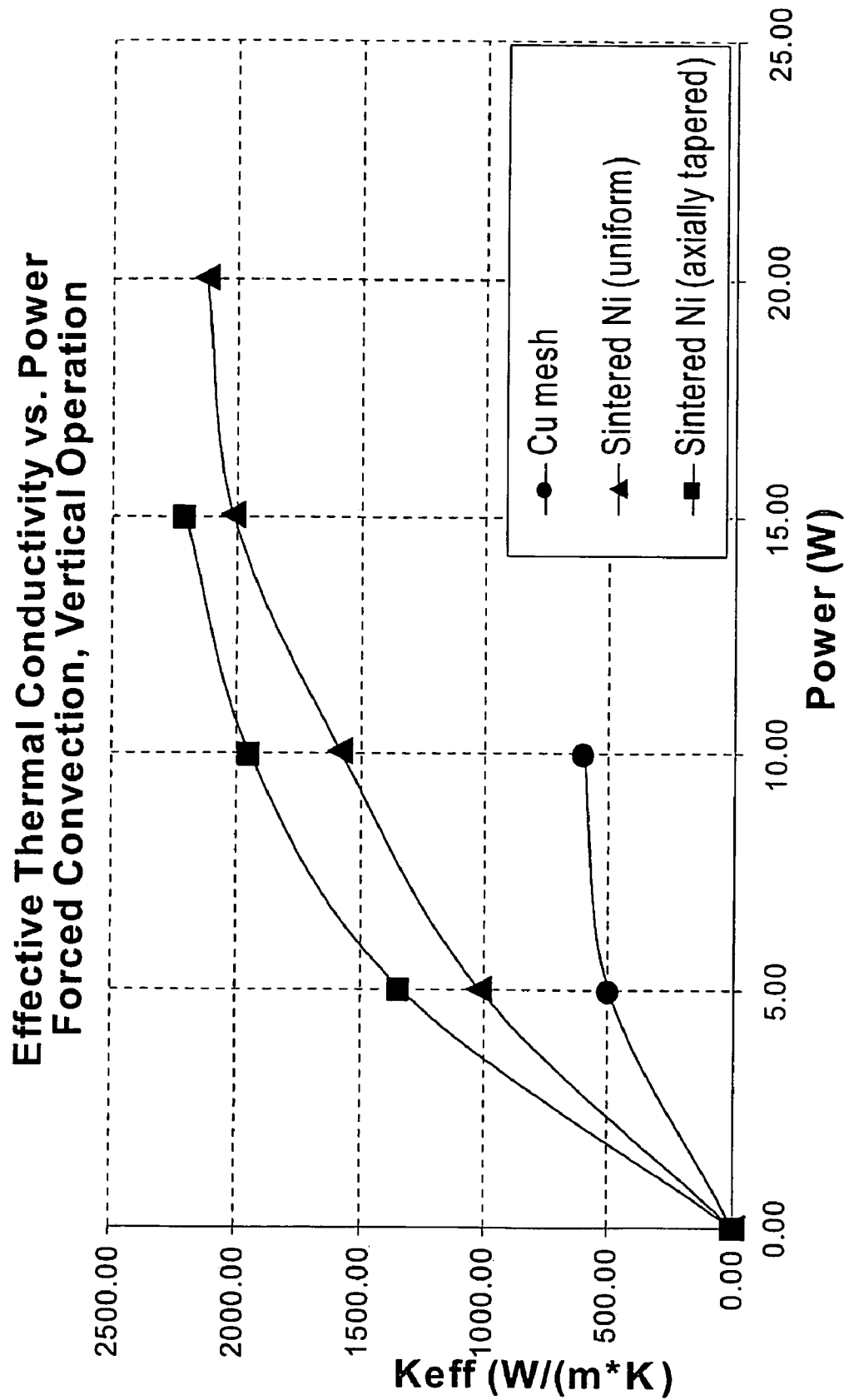
FIG. 8 is a plot of effective thermal conductivity of heat pipes containing hybrid nickel powder wicks (tested under against gravity position)

FIG. 8 presents the effective thermal conductivity of the sintered hybrid nickel wick structure tested under the against gravity condition. Again, a monolithic copper mesh heat pipe is included in this Figure as a baseline reference. It is evident that a uniform hybrid wick structure with sintered nickel offers a threefold improvement in the effective thermal conductivity. Furthermore, the axially varied hybrid wick, with larger concentration of small pores in evaporator section, increases the effective thermal conductivity by a factor of four over the baseline reference.

Figure 9:
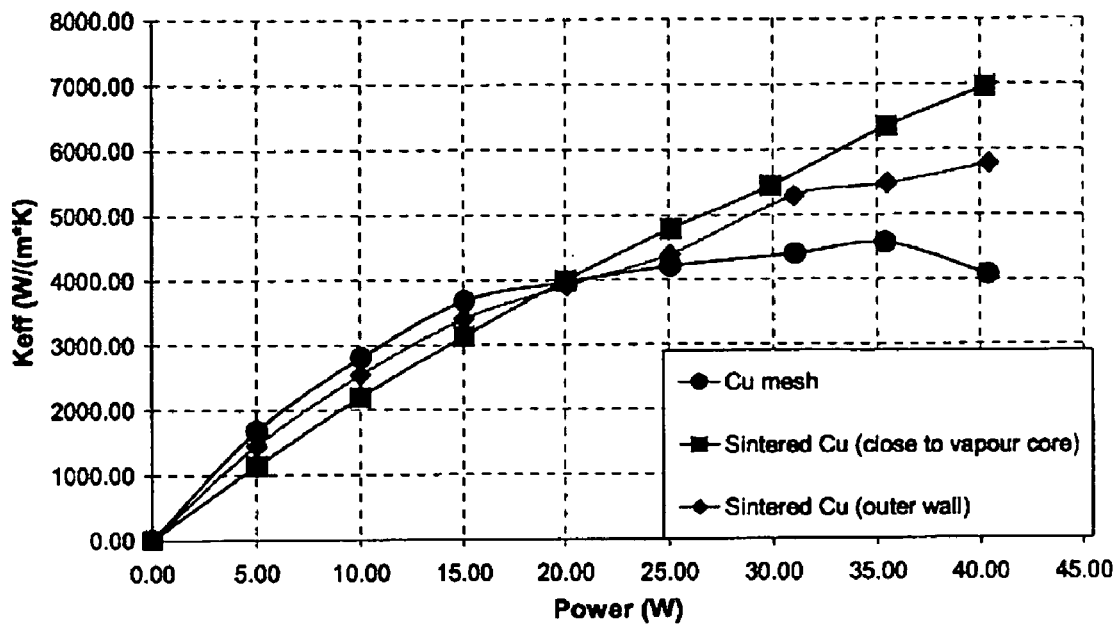
FIG. 9 shows the effective thermal conductivity of heat pipes containing hybrid copper powder wicks (tested under horizontal position)
Figure 10:
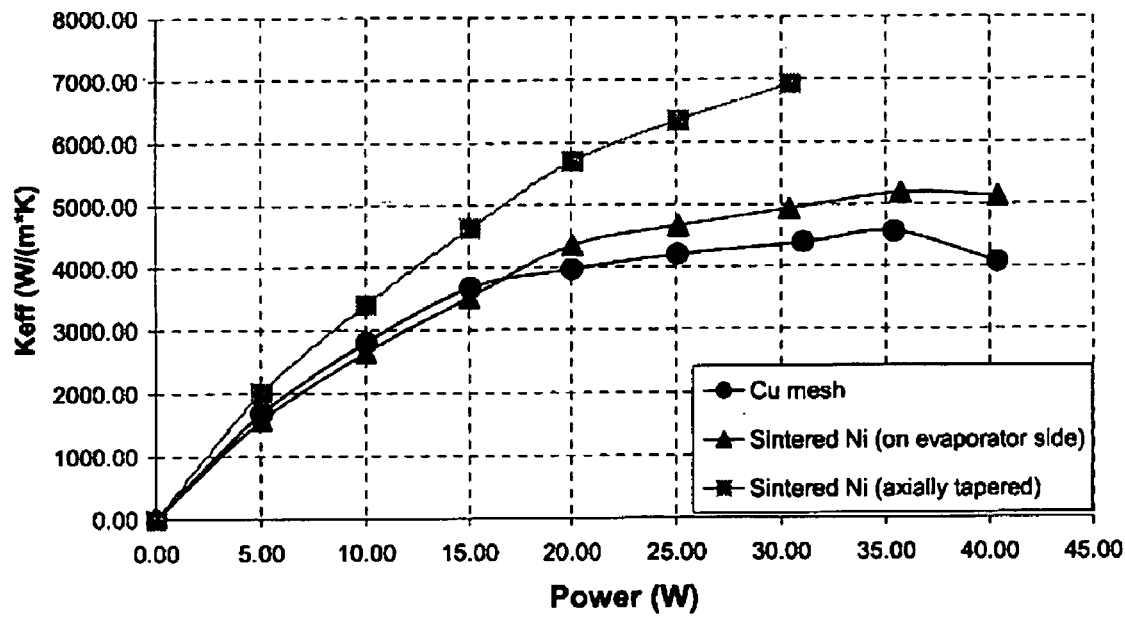
FIG. 10 shows the effective thermal conductivity of heat pipes containing hybrid nickel powder wicks (tested under horizontal position).

When the heat pipes containing the hybrid wick structure were tested under horizontal position, where less capillary pressure difference is required, improved performance was also observed. As shown in FIGS. 9 and 10, this improvement is pronounced particularly when the power input was higher than 20 W. The following two examples indicated the observed improvements.

EXAMPLE 5

As illustrated in FIG. 9, heat pipes with radially varied wick with larger concentration of small pores in the area adjacent to the vapor core exhibited 75% improvement of effective thermal conductivity at 40 W power input over that of heat pipes with monolithic copper mesh. This improvement is expected to increase further with the rise of power input. It is also observed in FIG. 9 that when larger concentration of smaller porous structure is placed against the heat pipe container wall, the improvement in effective thermal conductivity is less pronounced.

EXAMPLE 6

As illustrated in FIG. 10, when axially varied Ni bi-modal wick structure was used in the heat pipe, the heat transfer performance is also improved under horizontal position. The heat pipes containing gradually varied (axially tapered) porous structure, with larger concentration of small pores in evaporator section, demonstrated a 67% heat transfer performance improvement over heat pipes with monolithic Cu mesh. It is also observed in FIG. 10 that when large concentration of smaller pores is placed in the evaporator section only, as opposed to the gradually varied porous structure, the improvement in heat transfer efficiency is less pronounced.

Examples 1 and 2 illustrate the feasibility of fabricating the claimed bi-modal structure using sintering of Cu and Ni powder onto the selected substrate. Examples 3-6 are used to demonstrate the improvement achieved by employing hybrid wick structures. Depending on the chosen substrate, powder, container, packaging method, fluid type, heat pipe geometry, internal vacuum level and test setup, the effective thermal conductivity may vary significantly. It should be appreciated that numerous innovative wick material design and associated fabrication techniques exist, each of which possesses its own unique qualities. Numerous combinations of slurry composition and preparation, substrate selection, deposition techniques and control of sintering parameters can be used to obtain the desired performance.

A new hybrid, bi-modal wick material has been disclosed, primarily for use in heat pipes. Other applications requiring wick structures with tailored pore sizes, porosity, total surface area and compositions are also foreseeable. Background information was covered to emphasize the importance of heat pipes in industrial applications as well as the effect of wick parameters on heat pipe performance. Various manufacturing techniques were discussed, showing a wide range of possible fabrication routes leading to the final product.

As used herein, the terms "comprises", "comprising", "including" and "includes" are to be construed as being inclusive and open-ended. Specifically, when used in this document, the terms "comprises", "comprising", "including", "includes" and variations thereof, mean the specified features, steps or components are included in the described invention. These terms are not to be interpreted to exclude the presence of other features, steps or components.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

Therefore what is claimed is:

1. A wicking material, comprising;

a porous metal substrate of foam, felt, mesh, or screen, said porous metal substrate having a length defining an axial direction and a thickness defining a radial direction transverse to said axial direction, the porous metal substrate enclosing a vapor flow passageway in said axial direction, said porous metal substrate defining first pores of a first size; and a porous sintered metal powder formed on the porous metal substrate, said porous sintered metal powder defining second pores of a second size;

said porous sintered metal powder and said porous metal substrate forming a hybrid microstructure having said first pores of said first size and at least said second pores of said second size, said first size pores being larger than said second size pores, said second pore size being in a range selected to give capillary pumping of liquid, wherein a concentration of said second pores varies along said radial direction of said porous metal substrate in a spatially distributed manner, and furthermore in such a manner that a larger concentration of said second pores is located at a wick interface immediately adjacent to the vapor flow passageway;

wherein said porous sintered metal powder defining said second pores is attached to walls of said first pores whereby said second pores are incorporated onto the walls of the first pores so as to define a structure with no layer interfaces.

2. The wicking material according to claim 1 wherein said second pores are distributed along said axial direction of said porous metal substrate in such a manner that a larger concentration of said second pores are located near one end of the wicking material.

3. The wicking material according to claim 1 wherein said second pores are distributed along said axial direction of said porous metal substrate in such a manner that a larger concentration of said second pores are located near one end of said wicking material, and wherein said second pores are distributed along said radial direction of said porous metal substrate in such a manner that a larger concentration of said second pores are located at a wick interface immediately adjacent to said vapour flow passageway.

4. The wicking material according to claim 1 wherein said first pores are at least 5 times larger in size than said second pores.

5. The wick material according to claim 1 where said first pores have sizes in a range from about 50 to about 1000 micrometers.

6. The wick material according to claim 1 wherein said second pores have sizes in a range from about 0.5 to about 50 micrometers.

7. The wick material according to claim 1 wherein said second pores have characteristics including pore size and shape, porosity, and surface area controlled through selection of a type of said metal powder, slurry mixture composition used to apply said metal powder to said porous metal substrate, application technique for applying said slurry mixture composition to said porous metal substrate, and sintering process parameters.

8. The wicking material according to claims 1 wherein said porous metal substrate is made of a metal selected from the group consisting of nickel, copper, molybdenum, niobium, aluminium, iron, cobalt, titanium and alloys based on these metals, and combinations thereof.

9. The wicking material according to claim 1 wherein said sintered metal powder is made of a metal powder selected from the group consisting of nickel, copper, molybdenum, niobium, aluminium, iron, cobalt, titanium and alloys based on these metals, and combinations thereof.

10. The wick material according to claim 1 wherein said porous sintered metal powder is produced from a powder having a shape selected from the group consisting of spherical, irregular, filamentary or fiber.

11. The wick material according to claim 1 wherein said porous sintered metal powder is produced from a powder having a size in a range from several micrometers to several hundred micrometers.

12. The wick material according to any one of claim 1 wherein one or both of said porous metal substrate and said porous sintered metal powder formed on the porous metal substrate each include both said first and second pores.

13. A heat pipe, comprising;
- a metal housing having a wall defining a chamber and including an evaporator zone, an adiabatic zone downstream of said evaporator zone, and a condenser zone downstream of said evaporator zone;
- a wicking material contained in said chamber and spanning said evaporator, adiabatic and condenser zones, said wicking material including
- a porous metal substrate of foam, felt, mesh, or screen having a pore structure of controlled pore size and number of pores, said porous metal substrate having a length defining an axial direction and a thickness defining a radial direction transverse to said axial direction, the porous metal substrate enclosing a vapor flow passageway in said axial direction, said porous metal substrate defining first pores of a first size; and
- a porous sintered metal powder formed on the porous metal substrate, said porous sintered metal powder defining second pores of a second size;
- said porous sintered metal powder and said porous metal substrate forming a hybrid microstructure having said first pores of said first size and at least said second pores of said second size, said first size pores being larger than said second size pores, said second pore size being in a range selected to give capillary pumping of liquid; and
- wherein a concentration of said second pores varies along said radial direction of said porous metal substrate in a spatially distributed manner, and furthermore in such a manner that a larger concentration of said second pores is located at a wick interface immediately adjacent to the vapor flow passageway compared to a concentration of said second pores located along a heat pipe wall-wick interface;
- wherein when heat is absorbed into the evaporator zone liquid entrained in the wicking material is evaporated to form a vapor, and wherein the vapor flows down said vapor flow passageway through said adiabatic zone and into said condenser zone whereupon said vapour condenses to form said liquid thereby releasing heat, and wherein said liquid flows back through said wicking material to said evaporator zone;
- wherein said porous sintered metal powder defining said second pores is attached to walls of said first pores whereby said second pores are incorporated onto the walls of the first pores so as to define a structure with no layer interfaces;
- and wherein the wicking material is sintered to the wall of the heat pipe.

14. The heat pipe according to claim 13 wherein said second pores are distributed along said axial direction of said porous metal substrate in such a manner that a larger concentration of said second pores are located in said evaporator zone and a concentration of said second pores is gradually reduced throughout said evaporator zone and said adiabatic zone reaching a minimum before reaching said condenser zone and wherein said condenser zone is comprised primarily of said first pores.

15. The heat pipe according to claim 13 wherein said second pores are distributed along said axial direction of said porous metal substrate in such a manner that a larger concentration of said second pores are located in said evaporator zone and a concentration of the second pores is gradually reduced throughout said evaporator zone and said adiabatic zone reaching a minimum before reaching said condenser zone, and wherein said condenser zone is comprised primarily of said first pores, and wherein said second pores are distributed along said radial direction of said porous metal substrate in such a manner that a larger concentration of said second pores are located at a wick interface immediately adjacent to the vapor space passageway compared to a concentration of said second pores along a heat pipe wall-wick interface.

16. The heat pipe according to claim 13 wherein the first pores are at least five times larger in size than the second pores.

17. The heat pipe according to claim 13 where the first pore sizes are in a range from about 50 to about 1000 micrometers.

18. The heat pipe according to claim 13 where the second pore sizes are in a range from about 0.5 to about 50 micrometers.

19. The heat pipe according to claim 13 wherein said second pores have characteristics including pore size and shape, porosity, and surface area controlled through selection of a type of said metal powder, slurry mixture composition used to apply said metal powder to said porous metal substrate, application technique for applying said slurry mixture composition to said porous metal substrate, and sintering process parameters.

20. The heat pipe according to claim 13 wherein said porous metal substrate is made of a metal selected from the group consisting of nickel, copper, molybdenum, niobium, aluminium, iron, cobalt, titanium and alloys based on these metals, and combinations thereof.

21. The heat pipe according to claim 13 wherein said sintered metal powder is made of a metal powder selected from the group consisting of nickel, copper, molybdenum, niobium, aluminium, iron, cobalt, titanium and alloys based on these metals, and combinations thereof.

22. The heat pipe according to claim 13 wherein said porous sintered metal powder is produced from a powder having a shape selected from the group consisting of spherical, irregular, filamentary or fiber.

23. The heat pipe according to claim 13 wherein said porous sintered metal powder is produced from a powder having a size in a range from several micrometers to several hundred micrometers.

24. The heat pipe according to claim 13 wherein said wicking material is generally cylindrical, and wherein said vapor passageway extends down a middle of said cylindrically shaped material, and wherein said metal housing is cylindrical having a diameter to receive therein said wicking material.

25. The heat pipe according to claim 13 wherein one or both of said porous metal substrate and said porous sintered metal powder formed on said porous metal substrate each include both said first and second pores.

* * * * *